United States Patent
Shu et al.

(10) Patent No.: US 9,266,714 B2
(45) Date of Patent: Feb. 23, 2016

(54) MICRO-ELECTRO MECHANICAL SYSTEM (MEMS) STRUCTURES AND METHODS OF FORMING THE SAME

(71) Applicant: TAIWAN SEMICONDUCTOR MANUFACTURING COMPANY, LTD., Hsinchu (TW)

(72) Inventors: Chia-Pao Shu, New Taipei (TW); Chia-Ming Hung, Taipei (TW); Wen-Chuan Tai, Hsinchu (TW); Hung-Sen Wang, Tainan (TW); Hsiang-Fu Chen, Jhudong Township (TW); Alex Kalnitsky, San Francisco, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/253,224

(22) Filed: Apr. 15, 2014

(65) Prior Publication Data

US 2014/0203421 A1    Jul. 24, 2014

Related U.S. Application Data

(63) Continuation of application No. 13/399,903, filed on Feb. 17, 2012, now Pat. No. 8,716,852.

(51) Int. Cl.
  *B81B 7/00* (2006.01)
  *B81C 1/00* (2006.01)

(52) U.S. Cl.
  CPC ............. *B81B 7/0032* (2013.01); *B81B 7/0038* (2013.01); *B81C 1/00261* (2013.01); *H01L 2924/0002* (2013.01)

(58) Field of Classification Search
  CPC ......... H01L 21/50; H01L 21/54; H01L 23/26; H01L 29/84; H01L 2924/00; H01L 2924/0002
  See application file for complete search history.

(56) References Cited

U.S. PATENT DOCUMENTS

| | | | |
|---|---|---|---|
| 4,990,229 A | 2/1991 | Campbell et al. | |
| 7,429,495 B2 | 9/2008 | Wan | |
| 7,579,663 B2 | 8/2009 | Wan | |
| 7,659,150 B1 | 2/2010 | Monadgemo et al. | |
| 8,525,278 B2 | 9/2013 | Chu et al. | |
| 8,716,852 B2 * | 5/2014 | Shu et al. | 257/682 |
| 2005/0017313 A1 | 1/2005 | Wan | |
| 2006/0246631 A1 | 11/2006 | Lutz et al. | |
| 2008/0308920 A1 | 12/2008 | Wan | |
| 2011/0049652 A1 * | 3/2011 | Wu et al. | 257/417 |

(Continued)

FOREIGN PATENT DOCUMENTS

| | | |
|---|---|---|
| CN | 1578911 | 2/2005 |
| TW | I289538 | 11/2007 |
| TW | I295664 | 4/2008 |

OTHER PUBLICATIONS

Office Action dated Dec. 22, 2014 from corresponding No. TW 101122591.

*Primary Examiner* — Kyoung Lee
(74) *Attorney, Agent, or Firm* — Slater & Matsil, L.L.P.

(57) ABSTRACT

A device includes a first substrate bonded with a second substrate structure. The second substrate structure includes an outgasing prevention structure. At least one micro-electro mechanical system (MEMS) device is disposed over the outgasing prevention structure.

20 Claims, 9 Drawing Sheets

(56) References Cited

U.S. PATENT DOCUMENTS

| | | |
|---|---|---|
| 2011/0121415 A1 | 5/2011 | Quevy et al. |
| 2012/0313235 A1 | 12/2012 | Chu et al. |
| 2013/0036827 A1 | 2/2013 | Besling |
| 2013/0193527 A1 | 8/2013 | Chu et al. |

* cited by examiner

MICRO-ELECTRO MECHANICAL SYSTEM (MEMS) STRUCTURES AND METHODS OF FORMING THE SAME

PRIORITY CLAIM

The present application is a continuation of U.S. application Ser. No. 13/399,903, now U.S. Pat. No. 8,716,852, filed Feb. 17, 2012, which is incorporated herein by reference in its entirety.

TECHNICAL FIELD

The present disclosure relates generally to the field of semiconductor package systems and, more particularly, to micro-electro mechanical system (MEMS) structures and methods of forming the same.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. Such advances have increased the complexity of processing and manufacturing ICs and, for these advances to be realized, similar developments in IC processing and manufacturing are needed.

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
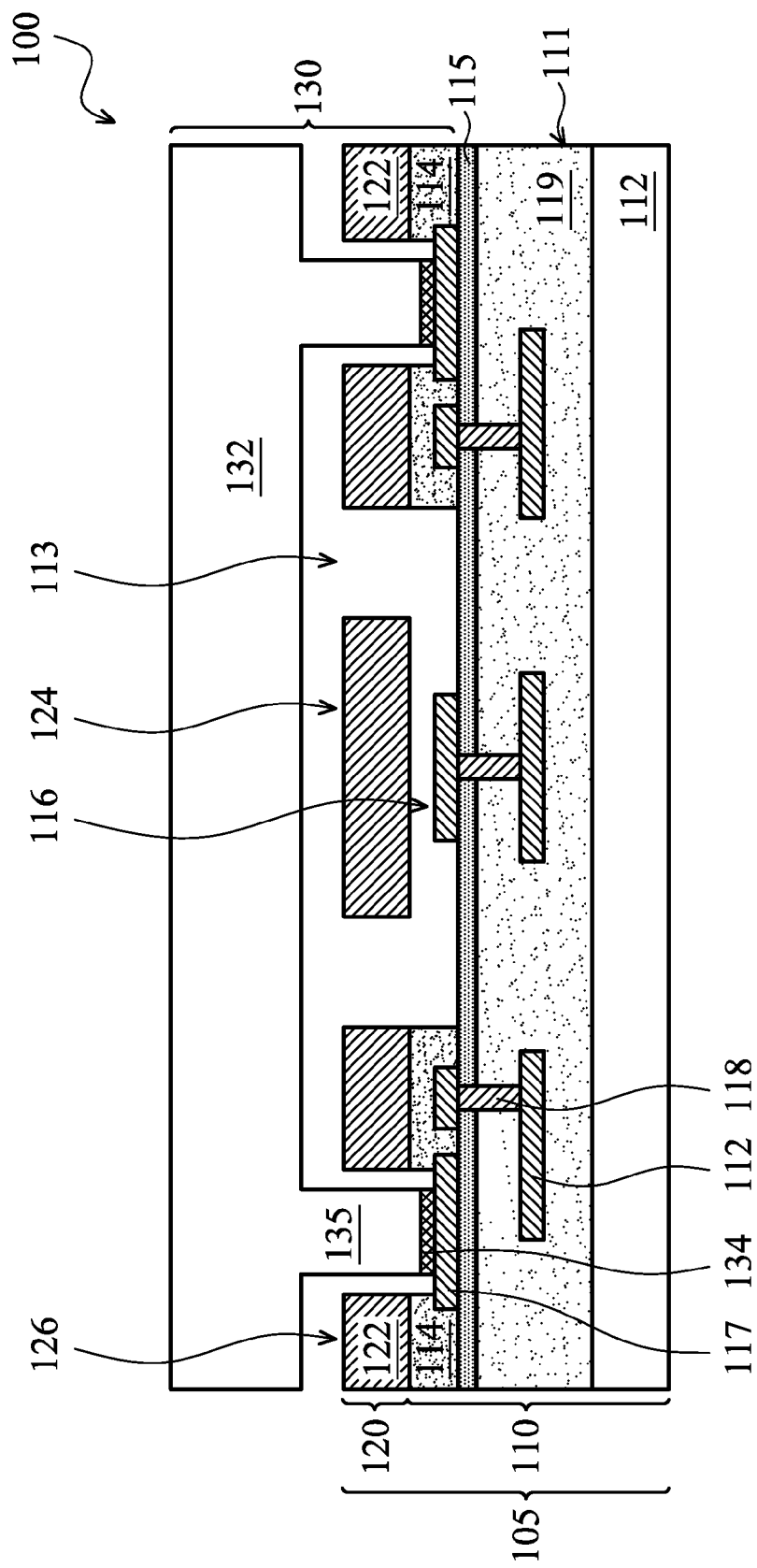
FIG. 1 is a schematic cross-sectional view of an exemplary micro-electro mechanical system (MEMS) structure according to some embodiments of this application.

Generally, a MEMS package system has a plurality of substrates that are bonded to each other. In a MEMS package system, a MEMS device is disposed in a space that is sealed by the bonded substrates. The space is vacuumed such that the operation of the MEMS device in the space is less affected. The substrates have a plurality of dielectric materials that are used to form an integrated circuit. It is found that gases may outgas from the dielectric materials into the space. The gases may change the ambient around the MEMS device and affect the operation of the MEMS device.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

The present disclosure is associated with MEMS structures and methods of forming the same. The MEMS structures each include an outgasing prevention structure that is configured to reduce outgasing from semiconductor materials disposed around a MEMS device. Following are descriptions regarding various exemplary MEMS structures and methods of forming the same. It is noted that the MEMS structures and methods described below are merely exemplary. The scope of this application is not limited thereto.

FIG. 1 is a schematic cross-sectional view of an exemplary micro-electro mechanical system (MEMS) structure according to some embodiments of this application. In FIG. 1, a substrate structure 130 is bonded with a substrate structure 105. In some embodiments, the substrate structure 105 includes at least one substrate structure, e.g., substrate structures 110 and 120 that are bonded with each other. In some embodiments, the substrate structures 105 and 130 are assembled to form a hermetic or non-hermetic package system. In some embodiments, the substrate structures 110, 120 and 130 include substrates 112, 122 and 132, respectively. In some embodiments, the substrate structure 130 is referred to as a capping substrate structure. The substrate 132 is referred to as a capping substrate. The substrate 122 is referred to as a MEMS substrate. The substrate 112 is referred to as an integrated circuit substrate.

In some embodiments, the substrates 112, 122 and 132 each include the same or different materials and may comprise any suitable combination of materials. For example, the substrates 112, 122 and 132 each can be a semiconductor substrate that includes an elementary semiconductor including silicon and/or germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate can have a gradient SiGe feature in which the Si and Ge composition change from one ratio at one location to another ratio at another location of the gradient SiGe feature. The alloy SiGe can be formed over a silicon substrate. The SiGe substrate may be strained. Furthermore, the substrates 112, 122 and/or 132 can be a semiconductor on insulator (SOI). In some examples, the substrates 112, 122 and/or 132 include a doped epi layer. In other examples, the substrates 112, 122 and/or 132 include a multilayer compound semiconductor structure. Alternatively, the substrates 112, 122 and/or 132 include a non-semiconductor material, such as a glass, fused quartz, or calcium fluoride.

In some embodiments, the substrate structures 110, 120 and/or 130 include at least one complementary metal-oxide-semiconductor (CMOS) integrated circuit, at least one microelectro mechanical system (MEMS) circuit, at least one interposer structure, other integrated circuits, and/or any combinations thereof. In some embodiments, the interposer structure represents a substrate that may merely include a conductive wire routing for an electrical connection and be free from including any active device.

For example, the substrate structure 105 includes an integrated circuit structure 111 formed over the substrate 112 as shown in FIG. 1. In some embodiments, the integrated circuit structure 111 is formed, for example, by a complementary metal-oxide-semiconductor (CMOS) technology. The integrated circuit structure 111 includes, for example but not limited to, a logic circuit, an analog circuit, a mixed-signal circuit, and/or any suitable integrated circuit. In some embodiments, the integrated circuit structure 111 includes an interconnect metallization structure (not labeled) that is formed over the substrate 112. The interconnect metallization structure is configured to provide electrical interconnections among active devices and/or passive devices formed on and/or over the substrate 112 and/or 122.

In some embodiments, the interconnect metallization structure includes at least one dielectric layer, e.g., a dielectric layer 114 and intermetal dielectric (IMD) materials 119. In some embodiments, the dielectric layer 114 and the IMD materials 119 each include at least one material, such as silicon oxide, silicon nitride, silicon oxynitride, silicon carbide, silicon oxycarbide, low dielectric constant (low-k) dielectric material, ultra low-k dielectric material, other dielectric materials, or any combinations thereof. In some embodiments using fusion bonding, the dielectric layer 114 is in contact with the substrate 122, which causes the substrate 122 and the dielectric layer 114 to hold together due to atomic attraction forces (i.e., Van der Waal forces). The substrate 122 and the dielectric layer 114 can be subjected to an annealing process, after which a solid bond is formed therebetween.

In some embodiments, the interconnect metallization structure includes a plurality of metallic layers, e.g., metallic layers 112 and 116. The metallic layers 112 and 116 are electrically coupled with each other through at least one via plug structure, e.g., a via plug structure 118. In some embodiments, the interconnect metallization structure is made of at least one material, such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), other suitable metallic materials, and/or any combinations thereof.

In some embodiments, the metallic layer 116 is referred to as a top metallic layer. The top metallic layer can be partially exposed to a space 113 that is sealed by the substrate structures 105 and 130. The metallic layer 116 includes at least one bonding pad structure, e.g., a bonding pad structure 117. The bonding pad structure 117 is configured to bond with a bonding pad structure 134 of the substrate structure 130. The bonding pad structures 117 and 134 each include a bonding material that is suitable for bonding. For example, the bonding pad structure 134 includes at least one semiconductor material, e.g., Ge, Si, silicon-germanium ($Si_xGe_{1-x}$), other semiconductor materials, and/or any combinations thereof. The bonding pad structure 117 includes at least one metallic material, e.g., Al, Cu, Ti, Ta, Au, Ni, Sn, other metallic materials, and/or any combinations. In other embodiments, the bonding pad structures 117 and 134 each includes at least one metallic material, e.g., Al, Cu, Ti, Ta, Au, Ni, Sn, other metallic materials, and/or any combinations.

Referring again to FIG. 1, the substrate structure 120 includes at least one MEMS device, e.g., a MEMS device 124. In some embodiments, the MEMS device 124 includes a plurality of elements formed of metal, polysilicon, dielectric, and/or other materials. The MEMS device 124 can include materials typically used in a CMOS fabrication process. Any configuration of the MEMS device 124 is possible, depending on the desired functionality. One or more of the elements depicted may be designed to provide MEMS mechanical structures. The MEMS mechanical structures may include structures or elements operable for mechanical movement. The MEMS device 124 can be formed using processes used in CMOS fabrication, for example, photolithography, etching processes (e.g., wet etch, dry etch, plasma etch), deposition processes, plating processes, and/or other suitable processes, which may utilize one or more masking and patterning steps. In some embodiments, the MEMS device 124 includes a motion sensor (e.g., a gyroscope, an accelerometer, etc.), a radio frequency (RF) MEMS device (e.g., an RF switch, filter, etc.), an oscillator, a MEMS microphone, or any other MEMS device.

In some embodiments, a socket (cavity)/stand-off structure is formed to bond the substrate structures 105 and 130. For example, the substrate structure 130 includes a stand-off structure 135 as shown in FIG. 1. A socket 126 (also referred to as an opening, trench, or cavity) is formed in the substrate structure 105. In some embodiments, the socket 126 is routed around the MEMS device 124. As shown in FIG. 1, the stand-off structure 135 of the substrate structure 130 is disposed into the socket 126 of the substrate structure 105, such that the bonding pad structures 117 and 134 contact with each other to form a bond.

In some embodiments, the socket 126 comprises any suitable dimension, such as a length and width, and provides a through-structure for the stand-off structure 135 of the substrate structure 105 to bond with the substrate structure 110. In some embodiments, the socket 126 has a dimension substantially similar to the stand-off structure 135. The socket 126 can be formed simultaneously or independently of the patterning process used to form the MEMS device 124. In some embodiments, the socket 126 is simultaneously formed during the MEMS device 124 patterning processes (i.e., using the same mask).

As noted, the stand-off structure 135 can comprise any suitable dimension, such as a length and width, and may be substantially similar in dimension to the socket 126. In some embodiments, the stand-off structure 135 and socket 126 have dimensions so that the stand-off structure 135 can fit into the socket 126 to bond the substrate structures 105 and 130. Exemplary dimensions may include a stand-off structure 135 with a length of approximately 50 μm and a width of approximately 50 μm, and the socket 126 with a length less than 50 μm and a width greater than 50 μm, such as approximately 80 μm. As shown in FIG. 1, a portion of the stand-off structure 135 is brought into the socket 126, such that the bonding pad structures 134 and 117 contact with each other to form a bond by any suitable bonding process, such as fusion or eutectic bonding processes.

In some embodiments, when the substrate structure 130 is bonded to the substrate structure 105 (i.e., the bonding pad structure 134 is in contact with the bonding pad structure 117), the dimensions of the stand-off structure 135 and the socket 126 are such that a space (not labeled) remains between the substrate structures 105 and 130. The space between the socket 126 and the stand-off structure 135 provides room for spill out of squeezed alloy arising during a bonding process. The stand-off/cavity structure thus can effectively contain spill out.

Referring again to FIG. 1, the integrated circuit structure 111 includes an outgasing prevention structure 115 that is disposed below the metallic layer 116 and the MEMS device 124. In some embodiments, the outgasing prevention structure 115 is in direct contact with the metallic layer 116. In some embodiments, at least a portion of the gas prevention structure 115 is exposed to the space 113 that is sealed by the bonded substrate structures 105 and 130. The outgasing prevention structure 115 is configured to prevent gases (e.g., oxygen, carbon dioxide, other gases, and/or any combinations thereof) outgasing from the intermetal dielectric (IMD) materials 119 of the integrated circuit structure 111. By preventing the outgasing from the IMD materials 119, the ambient around the MEMS device 124 that is sealed in the space 113 can be desirably maintained.

In some embodiments, the outgasing prevention structure 115 has a gas permissibility lower than that of the IMD materials 119 of the integrated circuit structure 111. The outgasing prevention structure can include at least one material selected from a group consisting of silicon nitride, silicon oxynitride, silicon carbide, silicon oxycarbide, and silicon carbon nitride. In some embodiments, the outgasing prevention structure 115 includes a single-layer structure or a multi-layer structure. In some embodiments, the outgasing prevention structure 115 includes at least a portion (not shown) covering at least a portion of sidewalls of the dielectric layer 114.

Figure 2:
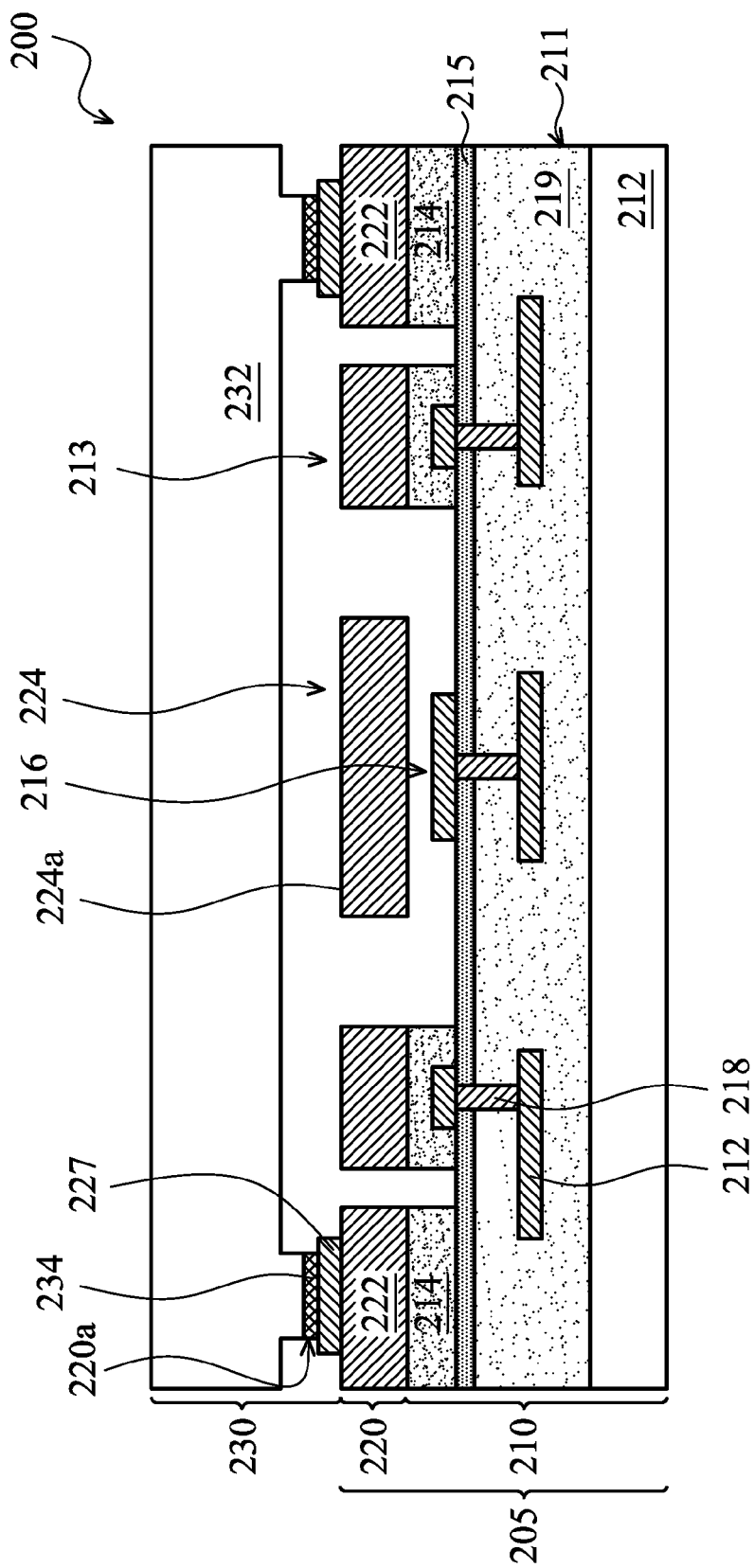
FIG. 2 is an exemplary cross-sectional view of another exemplary MEMS structure according to some embodiments of this application.

FIG. 2 is an exemplary cross-sectional view of another exemplary MEMS structure according to some embodiments of this application. Items of FIG. 2 that are the same or similar items in FIG. 1 are indicated by the same reference numerals, increased by 100. Detail descriptions of the same or similar items are not repeated. In FIG. 2, substrate structures 205 and 230 are bonded with each other to seal a space 213. In some embodiments, the substrate structure 205 includes substrate structures 210 and 220 that are bonded with each other. The substrate structures 210, 220 and 230 include substrates 212, 222 and 232, respectively.

Referring to FIG. 2, the substrate structure 205 includes an integrated circuit structure 211. The integrated circuit structure 211 includes an interconnect metallization structure (not labeled). The interconnect metallization structure includes at least one metallic line, e.g., metallic lines 212 and 216, and at least one via plug structure, e.g., a via plug structure 218. The integrated circuit structure 211 includes at least one dielectric layer, e.g., a dielectric layer 214 that is bonded with the substrate 222. The substrate structure 205 includes an outgasing prevention structure 215. The outgasing prevention structure 215 is disposed below the metallic layer 216. In some embodiments, the outgasing prevention structure 215 contacts the metallic layer 216.

As noted, the outgasing prevention structure 215 is configured to prevent gases (e.g., oxygen, carbon dioxide, other gases, and/or any combinations thereof) outgasing from intermetal dielectric (IMD) materials 219 of the integrated circuit structure 211 that is disposed below the outgasing prevention structure 215. By preventing the outgasing from the IMD materials 219, the ambient around the MEMS device 224 that is sealed in the space 213 can be desirably maintained.

Referring to FIG. 2, the substrate structure 220 includes at least one MEMS device 224. In some embodiments, the substrate structure 220 includes at least one bonding pad structure 227 that is disposed around the MEMS device 224. The bonding pad structure 227 is configured to bond with the bonding pad structure 234 of the substrate structure 230. In some embodiments, the material of the bonding pad structure 227 is the same as or similar to that of the bonding pad structure 117 described above in conjunction with FIG. 1.

In some embodiments, the substrate structure 230 is bonded to a surface 220a of the substrate structure 205. As shown in FIG. 2, the interface 220a between the bonding pad structures 227 and 234 is higher than a surface 224a of the MEMS device 224. In other embodiments, the bonding pad structure 234 is directly bonded to a surface of the substrate 222. The interface between the bonding pad structure 234 and the substrate 222 is substantially leveled with the surface 224a of the MEMS device 224.

Figure 3:
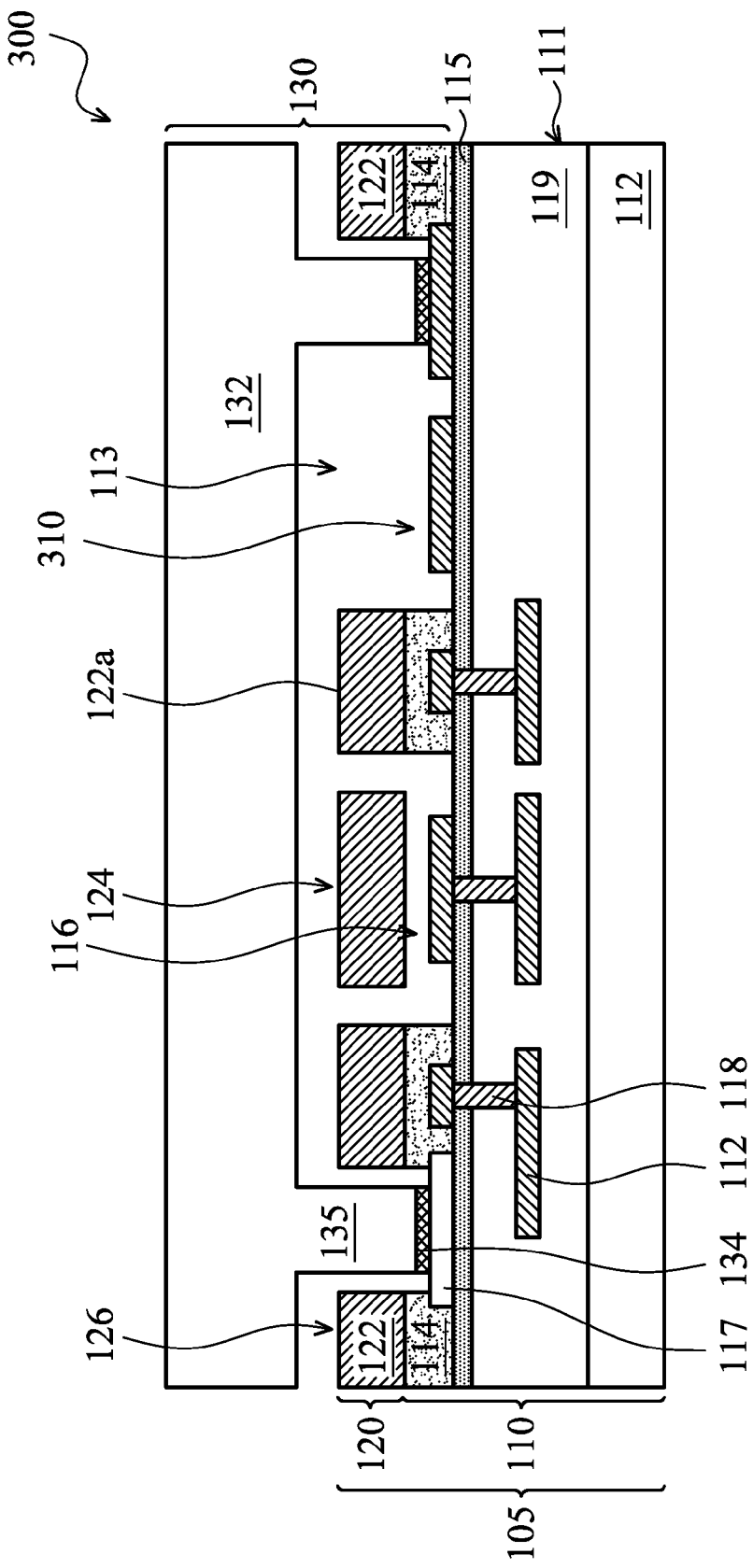
FIG. 3 is an exemplary cross-sectional view of an exemplary MEMS structure including at least one gas getter structure according to some embodiments of this application.

FIG. 3 is an exemplary cross-sectional view of an exemplary MEMS structure including at least one gas getter structure according to some embodiments of this application. In FIG. 3, a MEMS structure 300 includes at least one gas getter structure, e.g., a gas getter structure 310. The gas getter structure 310 is disposed over the outgasing prevention structure 115. The gas getter structure 310 is configured to absorb and/or consume at least a portion of gas that is sealed by the substrate structure 105 and 130. In some embodiments, the gas getter structure 310 includes at least one material, such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), other suitable metallic materials, and/or any combinations thereof. In some embodiments, the gas getter structure 310 is a portion of the metallic layer 116. In other embodiments, the gas getter structure 310 is made of a material which is different from that of the metallic layer 116.

Figure 4:
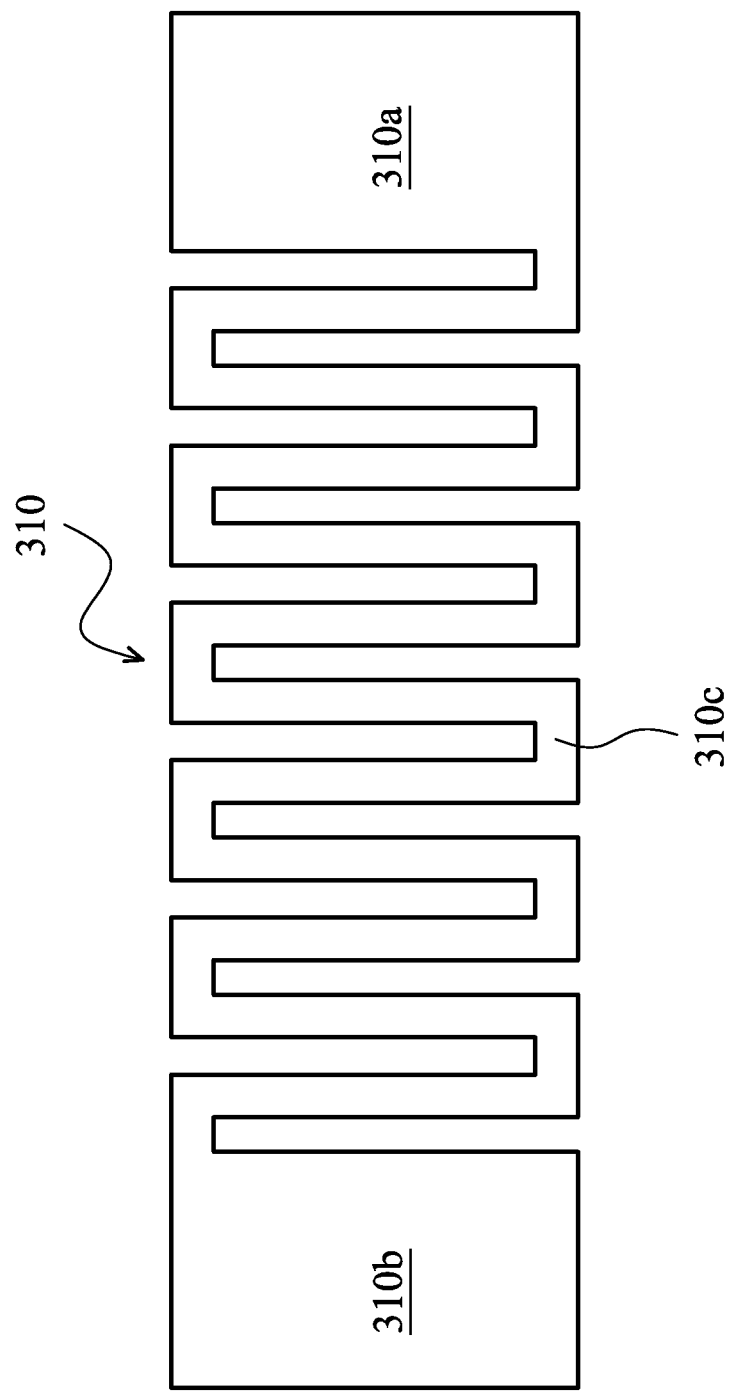
FIG. 4 is a schematic top view of an exemplary gas getter structure according to some embodiments of this application.

As noted, the gas getter structure 310 is configured to absorb and/or consume at least a portion of gas that is sealed by the substrate structure 105 and 130. For example, the gas getter structure 310 includes copper that is prone to reacting with oxygen that is in the space that is sealed by the substrate structures 105 and 130. In some embodiments, the gas getter structure 310 includes a fuse structure as shown in FIG. 4. In FIG. 4, the gas getter structure 310 includes electrode nodes 310a and 310b and a portion 310c between the electrode nodes 310a and 310b. By providing a current flowing from the electrode node 310a to the electrode node 310b, the portion 310c is heated up and prone to reacting with, for example, oxygen to generate metallic oxide.

It is noted that the routing of the gas getter structure 310 shown in FIG. 4 is merely exemplary. The scope of this application is not limited thereto. In some embodiments, the gas getter structure 310 includes at least one metallic stripe, line, other metallic structures, and/or any combination thereof.

It is noted that the location of the gas getter structure 310 shown in FIG. 3 is merely exemplary. In some embodiments, the gas getter structure 310 is disposed over a surface 122a of the substrate 122. In some embodiments, the gas getter structure 310 is disposed close to a surface of the substrate 132 that faces the space 113. In some embodiments, the gas getter structure 310 extends on at least a portion of sidewalls of the dielectric layer 114.

Figure 5:
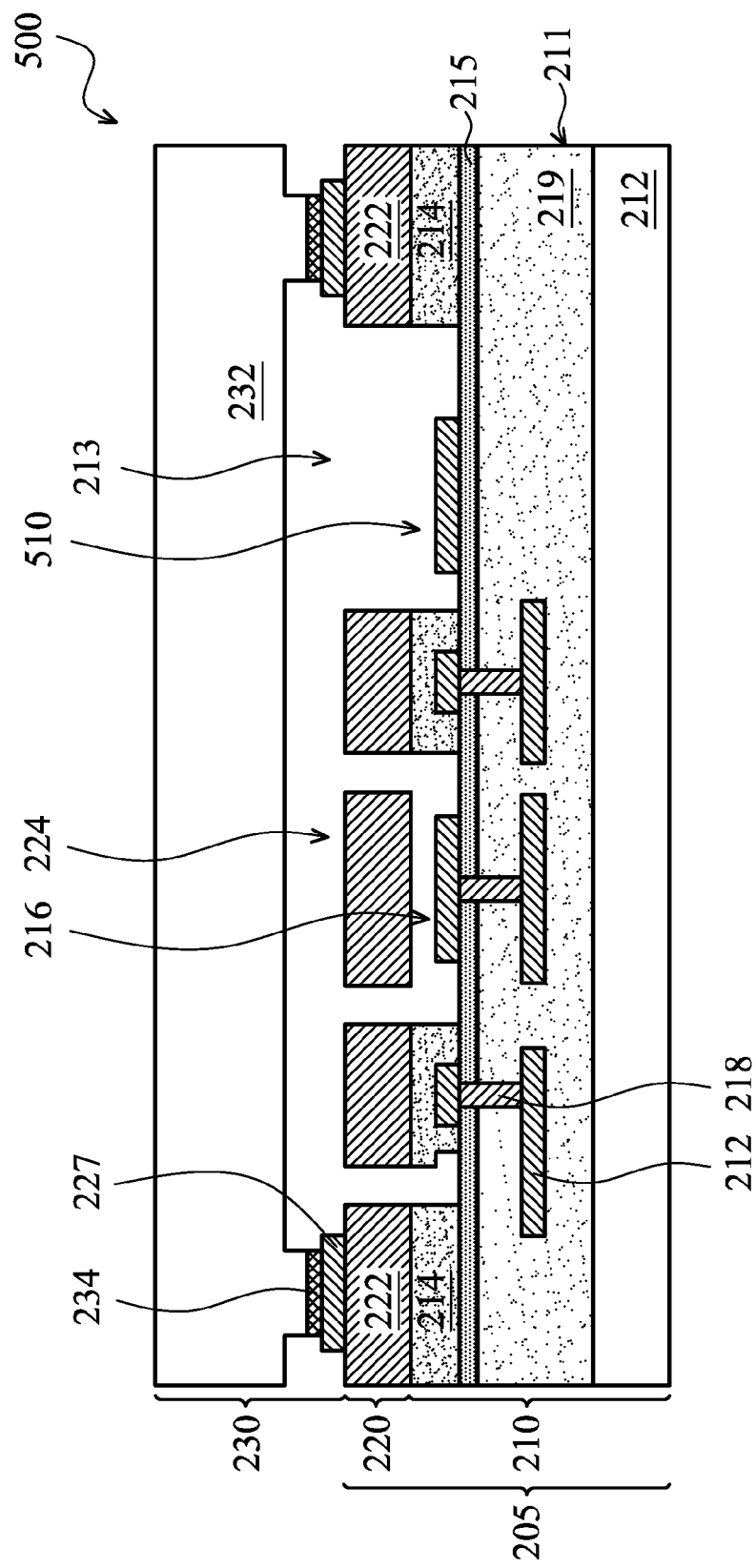
FIG. 5 is an exemplary cross-sectional view of another exemplary MEMS structure including at least one gas getter structure according to some embodiments of this application.

FIG. 5 is an exemplary cross-sectional view of another exemplary MEMS structure including at least one gas getter structure according to some embodiments of this application. In FIG. 5, a MEMS structure 500 includes at least one gas getter structure, e.g., a gas getter structure 510. The gas getter structure 510 is disposed over the outgasing prevention structure 215. The gas getter structure 510 is configured to absorb and/or consume at least a portion of gas that is sealed by the substrate structure 205 and 230. In some embodiments, the gas getter structure 510 is the same as or similar to the gas getter structure 310 described in conjunction with FIGS. 3 and 4.

Figure 6:
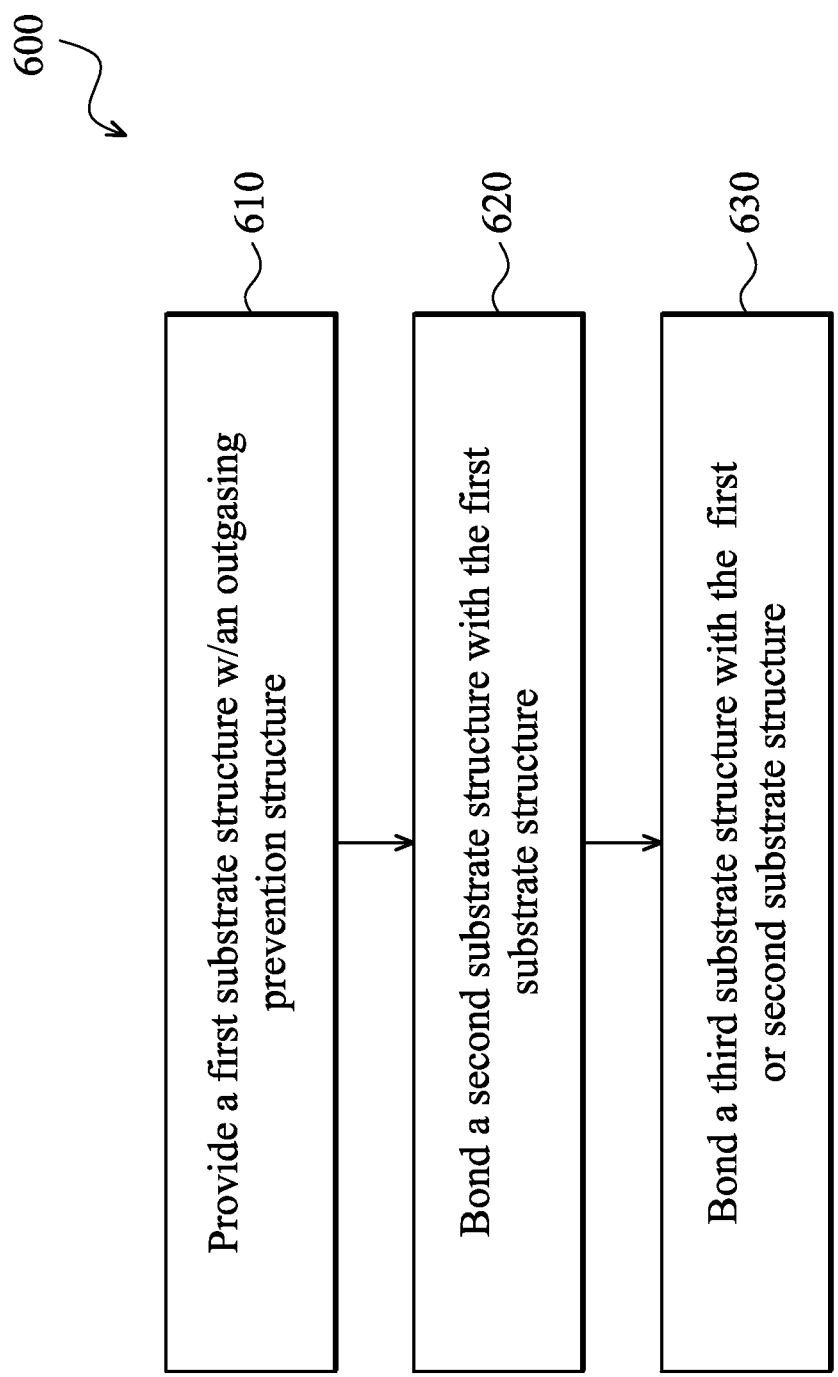
FIG. 6 is a flow chart illustrating an exemplary method for fabricating a MEMS structure according to some embodiments of this application.
Figure 7A:
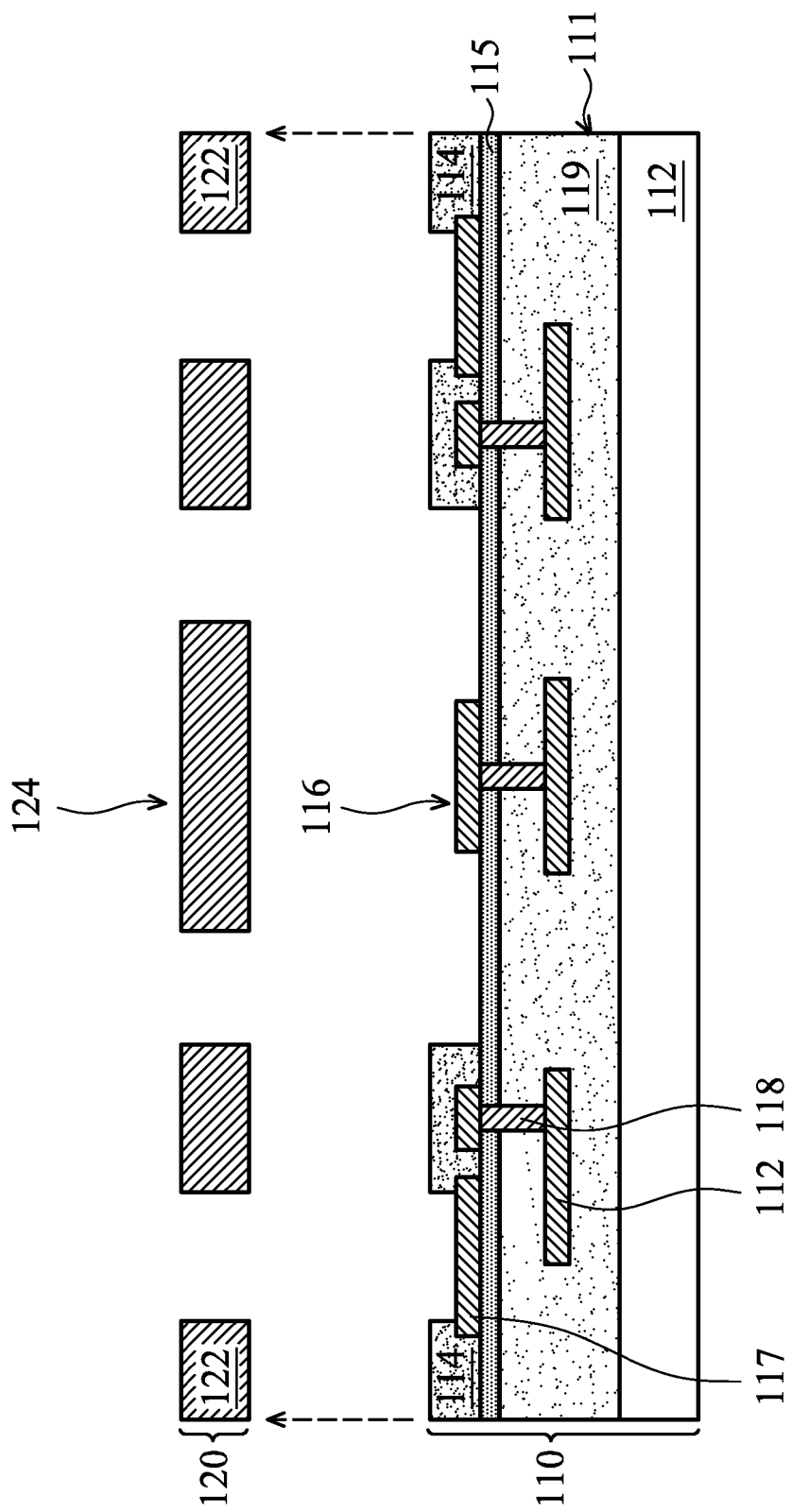
FIGS. 7A-7C are cross-sectional views of various stages of forming the MEMS structure by an exemplary method.
Figure 7B:
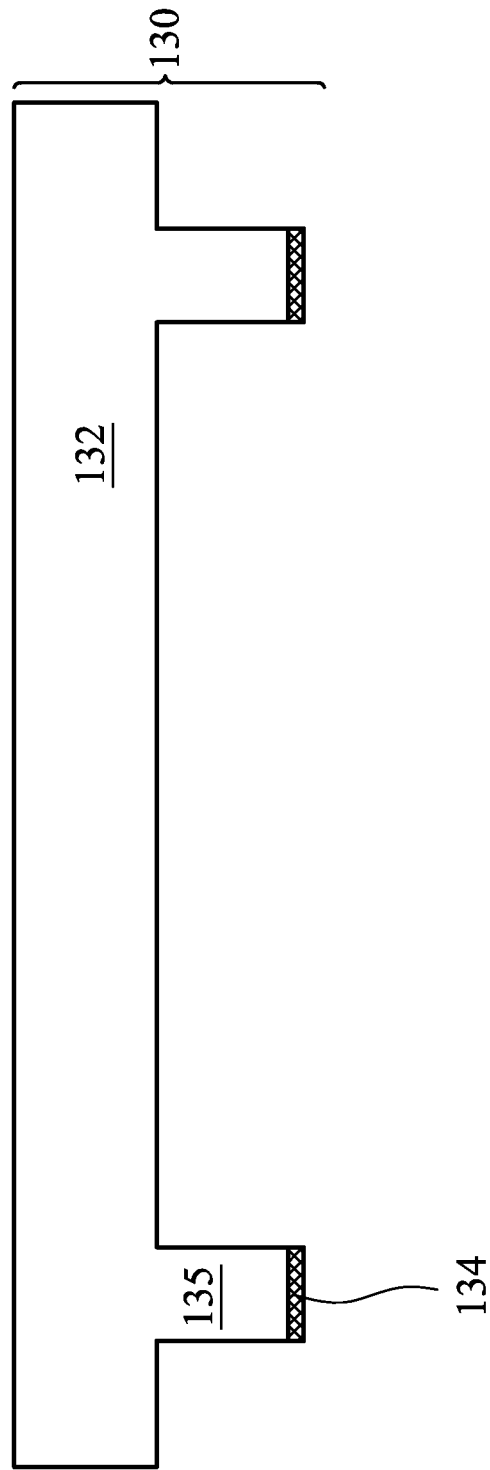
Figure 7C:
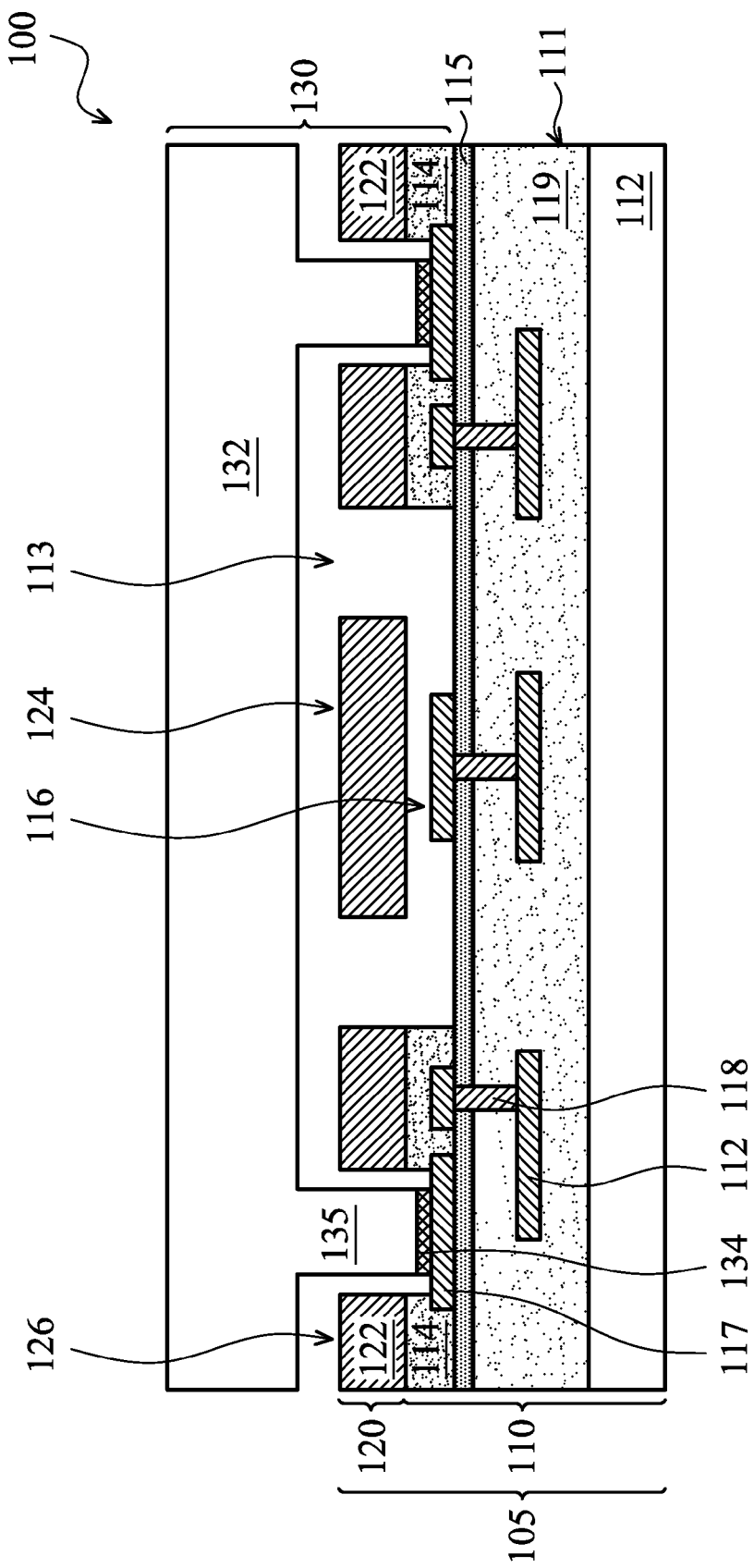

Following are descriptions related to exemplary processes of forming various MEMS structures described in conjunction with FIGS. 1-5. FIG. 6 provides a flow chart illustrating an exemplary method 700 for fabricating a MEMS structure. FIGS. 7A-7C are cross-sectional views of various stages of forming the MEMS structure by the method 600. It is understood that additional steps can be provided before, during, and after the method 600, and some of the steps described below can be replaced or eliminated for additional embodiments of the method. It is further understood that additional features can be added in the MEMS structure 100 and some of the features described below can be replaced or eliminated for additional embodiments of the MEMS structure 100. The method 600 and the corresponding MEMS structure 100 are exemplary only and not intended to be limiting.

Referring to FIG. 6, at block 610, a first substrate structure is provided, for example, the substrate structure 110 as illustrated in FIG. 7A. As noted, the substrate structure 110 includes a substrate 112. The substrate 112 can be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate may be a semiconductor on insulator (SOI). In some examples, the substrate 112 includes a doped epi layer. In other examples, the substrate 112 includes a multilayer compound semiconductor structure. Alternatively, the substrate 112 includes a non-semiconductor material, such as a glass, fused quartz, or calcium fluoride.

In some embodiments, the substrate structure 110 includes the integrated circuit structure 111. The integrated circuit structure 111 comprises memory cells, analog circuits, logic circuits and/or mixed-signal circuits (not shown). The integrated circuit structure 111 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. In an example, the substrate 110 includes one or more CMOS devices, such as transistors (e.g., NMOS and/or PMOS transistors). In some embodiments, the integrated circuit structure 111 includes circuitry associated with the transistors such as interconnect layers (e.g., metal lines and vias) and interlayer dielectric layers (ILD). In some embodiments, the integrated circuit structure 111 also includes isolation structures and/or any other elements associated with integrated circuitry.

In some embodiments, the method 600 includes forming the outgasing prevention structure 115 over the IMD materials 119. The metallic layer 116 is then formed over the outgasing prevention structure 115. The outgasing prevention structure 115 can be formed by, for example, a chemical vapor deposition (CVD) process, atomic layer deposition (ALD) process, high density plasma CVD (HDPCVD) process, other suitable methods, and/or any combinations thereof. In some embodiments, the dielectric layer 114 is formed over the outgasing prevention structure 115.

Referring to FIG. 6, at block 620, a second substrate structure is bonded with the first substrate structure. For example, the substrate structure 110 is bonded with the substrate structure 120 as illustrated in FIG. 7A. In some embodiments, the substrate structure 120 includes the MEMS device 124 in whole or in part. It is understood that the MEMS device 124 can be constructed before or after the substrate structure 120 is bonded to the substrate structure 110. In some embodiments, the MEMS device 124 includes a plurality of elements formed of metal, polysilicon, dielectric, and/or other materials. The MEMS device 124 can include materials used in a CMOS fabrication process. Any configuration of the MEMS device 124 is possible, depending on the desired functionality. One or more of the elements depicted above can be designed to provide MEMS mechanical structures. The MEMS mechanical structures may include structures or elements operable for mechanical movement. The MEMS device 124 can be formed using processes used in CMOS fabrication, for example, photolithography, etching processes (e.g., wet etch, dry etch, plasma etch), deposition processes, plating processes, and/or other suitable processes. In an embodiment, the MEMS device 124 includes a motion sensor (e.g., a gyroscope, an accelerometer, etc.), a radio frequency (RF) MEMS device (e.g., an RF switch, filter, etc.), an oscillator, a MEMS microphone, or any other MEMS device.

In some embodiments, the substrate structures 110 and 120 are bonded together by any suitable method, such as fusion or eutectic bonding processes. For example, the fusion bonding process involves bringing the substrate structures 110 and 120 into intimate contact, which causes the substrates 110 and 120 to hold together due to atomic attraction forces (i.e., Van der Waal forces). The substrate structures 110 and 120 are then subjected to an annealing process, after which a solid bond may be formed between the substrate structures 110 and 120. A temperature for the annealing process may be any suitable temperature, such as between about 200° C. and about 350° C. The fusion bonding process can arise from $SiO_2$/Si bonding, Si/Si bonding, and/or other suitable bonding. In some embodiments, the dielectric layer 114 can include high density plasma (HDP) oxide, tetraethylorthosilicate (TEOS) oxide, or plasma enhanced TEOS (PETEOS) oxide.

In some embodiments, the eutectic bonding process is applied between any alloy suitable for the bonding temperature boundary condition. For example, the eutectic bonding process includes metal/metal bonding and/or metal/semiconductor bonding, such as Ge/Al bonding, Ge/Au bonding, Si/Au bonding, Si/Al bonding, and/or other suitable bonding. If the bonding process involves a substrate including CMOS devices, one may control the bonding temperature near or lower than CMOS device temperature. The eutectic bonding processes may occur at high pressure and at any suitable temperature, such as between about 400° C. and 450° C.

Referring again to FIG. 6, at block 630, a third substrate structure is bonded with the first substrate structure. For example, the substrate structure 130 shown in FIG. 7B is provided. As noted, the substrate structure 130 includes the stand-off structure 135 and the bonding pad structure 134. In some embodiments, the stand-off structure 135 is formed using typical processes used in CMOS fabrication, for example, photolithography, etching processes (e.g., wet etch, dry etch, plasma etch), deposition processes, plating processes, and/or other suitable processes. Using only a single mask for forming the stand-off structure 135 on the substrate 132 may advantageously result in decreased manufacturing costs and time.

Referring to FIG. 7C, the substrate structure 130 is bonded with the substrate structure 110. A portion of the stand-off structure 135 is brought into contact with a portion of the bonding pad structure 117 of the substrate structure 110 to form a bond by any suitable bonding process, such as the fusion and eutectic bonding processes discussed above. In some embodiments, the substrate structures 110 and 130 are eutectic bonded to each other. In some embodiments, the eutectic bonding process can be applied between any alloy suitable for the bonding temperature boundary condition. For example, the eutectic bonding process may include metal/metal bonding and/or metal/semiconductor bonding, such as Ge/Al bonding, Ge/Au bonding, Si/Au bonding, Si/Al bonding, and/or other suitable bonding. If the bonding process involves a substrate including CMOS devices, one may control the bonding temperature near or lower than CMOS device temperature limitations. The eutectic bonding processes may occur at high pressure and at any suitable temperature, such as between about 400° C. and 450° C.

In other embodiments, the third substrate structure is bonded with the second substrate structure. For example, the substrate structure 230 is bonded with the substrate structure 220 by a eutectic bonding or fusion bonding process as shown in FIG. 2.

In some embodiments forming the gas getter structure 310 in the MEMS structure 300 described above in conjunction with FIG. 3, the method 600 further includes forming the gas getter structure 310 over the outgasing prevention structure 115. In some embodiments, the gas getter structure 310 is a portion of the metallic layer 116. The gas getter structure 310 can be patterned by the photolithographic and etching processes that are used to pattern the metallic layer 116.

According to some embodiments, a device includes a first substrate bonded to a second substrate structure. The second substrate structure includes an outgasing prevention structure. At least one micro-electro mechanical system (MEMS) device is disposed over the outgasing prevention structure.

According to some embodiments, a micro-electro mechanical system (MEMS) structure includes a first substrate structure. The first substrate structure includes an outgasing prevention structure disposed over a dielectric material. A second substrate structure is disposed over the first substrate structure, the second substrate structure including at least one MEMS device. A third substrate structure is disposed over the second substrate structure.

According to some embodiments, a method of forming a micro-electro mechanical system (MEMS) structure includes bonding a second substrate structure to a first substrate structure. The first substrate structure comprises an outgasing prevention structure and the second substrate structure comprises at least one MEMS device. The method also includes bonding a third substrate structure to the first substrate structure or the second substrate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first substrate; and
   a second substrate structure bonded to the first substrate, the second substrate structure comprising:
      an outgasing prevention structure;
      a dielectric layer over the outgasing prevention structure;
      a gas getter structure over the outgasing prevention structure, the gas getter structure extending onto a sidewall of the dielectric layer; and
      at least one micro-electro mechanical system (MEMS) device over the outgasing prevention structure.

2. The device of claim 1, wherein the outgasing prevention structure comprises at least one material selected from the group consisting of silicon nitride, silicon oxynitride, silicon carbide, silicon oxycarbide, and silicon carbon nitride.

3. The device of claim 1, wherein the first substrate comprises a stand-off portion extending through an opening of the second substrate structure and contacting a top metallic layer over the outgassing prevention structure.

4. The device of claim 1, wherein the first substrate is bonded to a surface of the second substrate structure that is substantially coplanar with or closer to the first substrate than a surface of the at least one MEMS device.

5. The device of claim 1, wherein the gas getter structure comprises at least one metallic material.

6. The device of claim 1, wherein the gas getter structure comprises a fuse structure.

7. The device of claim 1, wherein the gas getter structure comprises aluminum (Al), copper (Cu), tungsten (W), cobalt (Co), platinum (Pt), silicon (Si), germanium (Ge), titanium (Ti), tantalum (Ta), gold (Au), nickel (Ni), or tin (Sn).

8. The device of claim 1, further comprising a metallic layer over the outgasing prevention structure, wherein the gas getter structure is a portion of the metallic layer.

9. The device of claim 1, wherein the gas getter structure has a u-shaped portion.

10. A micro-electro mechanical system (MEMS) structure comprising:
    a first substrate structure comprising
       an outgasing prevention structure over a dielectric material; and
       a gas getter structure over the outgasing prevention structure and in contact with the dielectric material;

a second substrate structure over the first substrate structure, the second substrate structure including at least one MEMS device; and a third substrate structure over the second substrate structure.

11. The structure of claim 10, wherein the outgasing prevention structure includes at least one material selected from the group consisting of silicon nitride, silicon oxynitride, silicon carbide, silicon oxycarbide, and silicon carbon nitride.

12. The structure of claim 10, wherein the third substrate structure comprises a stand-off portion extending through an opening of the second substrate structure and contacting a top metallic layer over the outgasing prevention structure.

13. The structure of claim 10, wherein the third substrate structure is bonded to the second substrate structure.

14. The structure of claim 10, wherein the MEMS device is a motion sensor, a radio frequency (RF) device, an oscillator, or a microphone.

15. The structure of claim 10, wherein the first substrate comprises a protrusion configured to mate with an opening defined within the second substrate.

16. The structure of claim 15, wherein the first substrate structure and the second substrate structure are bonded together having the protrusion of the first substrate structure in contact with a bond pad over the outgasing prevention structure.

17. A method of forming a micro-electro mechanical system (MEMS) structure, the method comprising:

forming at least one gas getter structure over an outgasing prevention structure of a first substrate structure, the gas getter structure being formed in contact with a dielectric layer of the first substrate structure;

bonding a second substrate structure to the first substrate structure, wherein the second substrate structure comprises at least one MEMS device; and bonding a third substrate structure to the first substrate structure or the second substrate structure.

18. The method of claim 17, wherein bonding the second substrate structure to the first substrate structure comprises a eutectic bonding process or a fusion bonding process.

19. The method of claim 17, wherein bonding the third substrate structure to the first substrate structure or the second substrate structure comprises a eutectic bonding process or a fusion bonding process.

20. The method of claim 17, wherein forming the at least one gas getter structure comprises depositing a metal layer over the outgasing prevention structure, and etching the metal layer to pattern the metal layer into at least one metal strip to form the at least one gas getter structure.

* * * * *